United States Patent
Chakraborty et al.

(10) Patent No.: US 11,075,639 B1
(45) Date of Patent: Jul. 27, 2021

(54) FREQUENCY DIVIDER WITH DELAY COMPENSATION

(71) Applicant: International Business Machines Corporation, Armonk, NY (US)

(72) Inventors: Sudipto Chakraborty, Plano, TX (US); Yang You, Austin, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/880,387

(22) Filed: May 21, 2020

(51) Int. Cl.
| | |
|---|---|
| H03L 7/183 | (2006.01) |
| H03K 21/02 | (2006.01) |
| H03L 7/191 | (2006.01) |
| G05F 1/575 | (2006.01) |
| H03L 7/187 | (2006.01) |

(52) U.S. Cl.
CPC .............. *H03L 7/191* (2013.01); *G05F 1/575* (2013.01); *H03K 21/026* (2013.01); *H03L 7/183* (2013.01); *H03L 7/187* (2013.01)

(58) Field of Classification Search
CPC ......... H03L 7/183; H03L 7/18; H03K 21/026; H03K 23/542
See application file for complete search history.

(56) References Cited

U.S. PATENT DOCUMENTS

| | | |
|---|---|---|
| 6,950,490 B1 | 9/2005 | Koh et al. |
| 7,348,818 B2 | 3/2008 | Hulfachor et al. |
| 8,264,259 B2 | 9/2012 | Higashi |
| 9,281,810 B2 | 3/2016 | Singh et al. |
| 9,385,769 B2 | 7/2016 | Elzeftawi |
| 9,800,249 B2 | 10/2017 | Rajavi et al. |

OTHER PUBLICATIONS

Zhou, Hanchao, et al. "A 0.3~17.2 GHz frequency divider with capacitive degeneration in 130nm CMOS." 2012 IEEE 11th International Conference on Solid-State and Integrated Circuit Technology. IEEE, 2013. (Year: 2013).*

A wide-band divide-by-3 injection-locked frequency divider using tunable MOS resistor Sheng-Lyang Jang; Wen-Cheng Lai; Shune-Shing Tzeng; Ching-Wen Hsue 2015 IEEE Asian Solid-State Circuits Conference (A-SSCC) Year: 2015 | Conference Paper | Publisher: IEEE.

"Tunable linear MOS resistor for RF applications" Xinbo Xiang; Johannes Sturm 2012 IEEE 12th Topical Meeting on Silicon Monolithic Integrated Circuits in RF Systems Year: 2012 | Conference Paper | Publisher: IEEE.

"MOS characteristics and a modified linear MOS resistor" Karthi Balasubramanian; Kumar V Vineeth; A Neeraj; Krishnan M Nikhil 2009 International Conference for Technical Postgraduates (TECHPOS) Year: 2009 | Conference Paper | Publisher: IEEE.

* cited by examiner

*Primary Examiner* — Ryan Johnson
(74) *Attorney, Agent, or Firm* — Robert R. Williams

(57) ABSTRACT

A method and apparatus for controlling a frequency range of a self-resonant frequency (SRF) of a high speed divider implemented in current mode logic (CML) D triggers by controlling a field effect transistor (FET) load resistor bias voltage to FETs operating in linear regions in load resistors in the CML D triggers. Tail currents of the CML D triggers are controlled to track inversely to a resistor value.

8 Claims, 8 Drawing Sheets

| | Process corner | T=-40C | T=27C | T=125C |
|---|---|---|---|---|
| Uncompensated amplitude and SRF | tt (amplitude,mV) | 295.0 | 320.0 | 331.6 |
| | tt (freq, MHz) | 6610.4 | 6978.9 | 7782.1 |
| | ss (amplitude,mV) | 222.5 | 248.5 | 273.8 |
| | ss (freq, MHz) | 6725.2 | 7053.9 | 7678.0 |
| | ff (amplitude,mV) | 364.8 | 383.8 | 361.5 |
| | ff (freq, MHz) | 6515.9 | 6948.8 | 8097.5 |

| | Process corner | T=-40C | T=27C | T=125C |
|---|---|---|---|---|
| Compensated amplitude and SRF | tt (amplitude,mV) | 455.8 | 492.5 | 566.0 |
| | tt (freq, MHz) | 8528.6 | 8557.5 | 8439.5 |
| | vgb (mV) | 130 | 80 | 40 |
| | ss (amplitude,mV) | 373.2 | 418.3 | 553.1 |
| | ss (freq, MHz) | 8743.6 | 8655.3 | 8469.8 |
| | vgb (mV) | 100 | 50 | 0 |
| | ff (amplitude,mV) | 505.3 | 556.2 | 625.9 |
| | ff (freq, MHz) | 8754.3 | 8577.4 | 8496.9 |
| | vgb (mV) | 150 | 110 | 90 |

| Max SRF variation (%) | 3.73 |
|---|---|
| Max SRF variation (%) | 24.27 | ss    NFET and PFET are slow
ff    NFET and PFET are fast
tt    NFET and PFET are typical
SRF    Self Resonant Frequency

Fig. 6

FREQUENCY DIVIDER WITH DELAY COMPENSATION

BACKGROUND

High speed clocking systems in electronic apparatus such as computers often use a phase locked loop, comprising a phase/frequency detector, a charge pump, a loop filter, a variable frequency oscillator (VFO) having a frequency depending on voltage output of the loop filter, a high speed divider, and a digital divider. The high speed divider is often a current mode logic (CML) divide by two circuit.

SUMMARY

Embodiments of the invention provide a high-speed current mode logic (CML) clocking system having a phase/frequency detector, a charge pump, a loop filter; a variable frequency oscillator (VFO), a high speed divider to divide a differential high frequency signal received from the VFO, and a digital divider. The high speed divider is compensated to have a self-resonant frequency (SRF) slightly faster than half a frequency of the differential high frequency signal from the VFO. The compensation reduces effects of resistor and capacitor tolerances and reduces SRF variation caused by process variation and temperature. A small variability in SRF variation allows a designer to use a smaller tail current in CML trees used in the high speed divider and therefore reduces power consumption.

Embodiments of the invention provide for a tail bias circuit to control the tail current to control an output swing magnitude.

Embodiments of the invention provide a reduction in SRF variation in a divide by two CML high speed divider by making the SRF of the high speed divider near and slightly above half of a differential high frequency signal from the VFO which drives into the high speed divider's clock inputs. A margin is provided between half the VFO frequency and the SRF. For example, the SRF may be designed to be 10% faster than half the frequency of the VFO. If half the VFO differential high frequency signal frequency is above the SRF, the required input amplitude to the high speed divider must be higher. Frequency of the SRF is determined by capacitance and load resistance used to charge the capacitance. Capacitance and resistance in integrated circuits can vary considerably, e.g., plus or minus 50% or more. Embodiments of the invention compensate for process and temperature variability by using Field Effect Transistors (FETs) biased in linear regions to control load resistors (used to charge capacitances) to control the SRF of the high speed divider.

In an embodiment, during a calibration time, the high speed divider is set to self-resonate for a specified time period without being clocked. During this period, cycles from the self-resonation are counted in a single. At the end of the calibration time, the number of cycles counted are compared to a high threshold and a low threshold. If the number of cycles is higher than the high threshold, the load resistance is increased to slow charging of the capacitance which slows the SRF. If the number of cycles is lower than the low threshold, the load resistance is decreased to increase charging of the capacitance which speeds the SRF. This process may be repeated until the cycle count is between the high threshold and the low threshold.

In an embodiment, the high speed divider comprises two CML D triggers coupled together and clocked to divide the differential high frequency signal from the VFO by two.

During the calibration time, the differential high frequency signal to clock inputs of the CML D trigger blocks are replaced by a common mode voltage of the differential high frequency signal to the clock inputs of the CML D trigger blocks.

The CML D triggers have a circuit delay dominated by charge-up of capacitance by load resistors in the CML D triggers. The load resistors are controlled to set the SRF of the high speed divider during a calibration time.

In an embodiment, a tail current in the CML D triggers is controlled by a tail gate bias circuit to control a common mode voltage of a differential output of the high speed divider is set at a predetermined voltage.

BRIEF DESCRIPTION OF THE SEVERAL VIEWS OF THE DRAWINGS

FIG. 6 is a table showing results of a simulation demonstrating the usefulness of embodiments of the invention to reduce variability in SRF of the high frequency divider.

DETAILED DESCRIPTION

Embodiments presented in this detailed description provide a high-speed current mode logic (CML) integrated circuit used to provide a divide by two function for a high speed clock generation system that outputs a high speed clock output. Current mode logic (CML) dividers typically use a resistive load and consume a tail current to provide a swing and a delay that is proportional to the load resistance. In modern fine line CMOS (Complementary Metal Oxide Semiconductor) processes, a load resistance may vary significantly, for example, plus or minus 50% from a nominal value. This variation leads to significant variation of delay and signal swing. At some process and temperature corners, significant performance loss may occur due to resistance variations. If a margin between a desired half a differential high frequency signal frequency from the VFO in the high speed clock generation system and a self-resonant frequency (SRF) in the divide by two in the clock generation system is not respected, then the divide by two may lead to significant jitter and degradation of the high speed clock output produced by the high speed clock generation system.

Embodiments of the invention control load resistance values and tail current values to maintain the SRF within a specified frequency difference of a frequency of half of the differential high frequency signal in the high speed clock generation system. For example, the SRF should be higher than half the frequency of the differential high frequency signal from the VFO in a clock generation system. A margin between the SRF and half the frequency of the VFO differential high frequency signal may be 5% to 25%, for example. Required input amplitude to the CML divide by two increases as the differential high frequency signal from the VFO increases past twice the SRF; to accommodate the higher input amplitude, a larger tail current is needed, which increases power of the CML circuitry.

Figure 1:
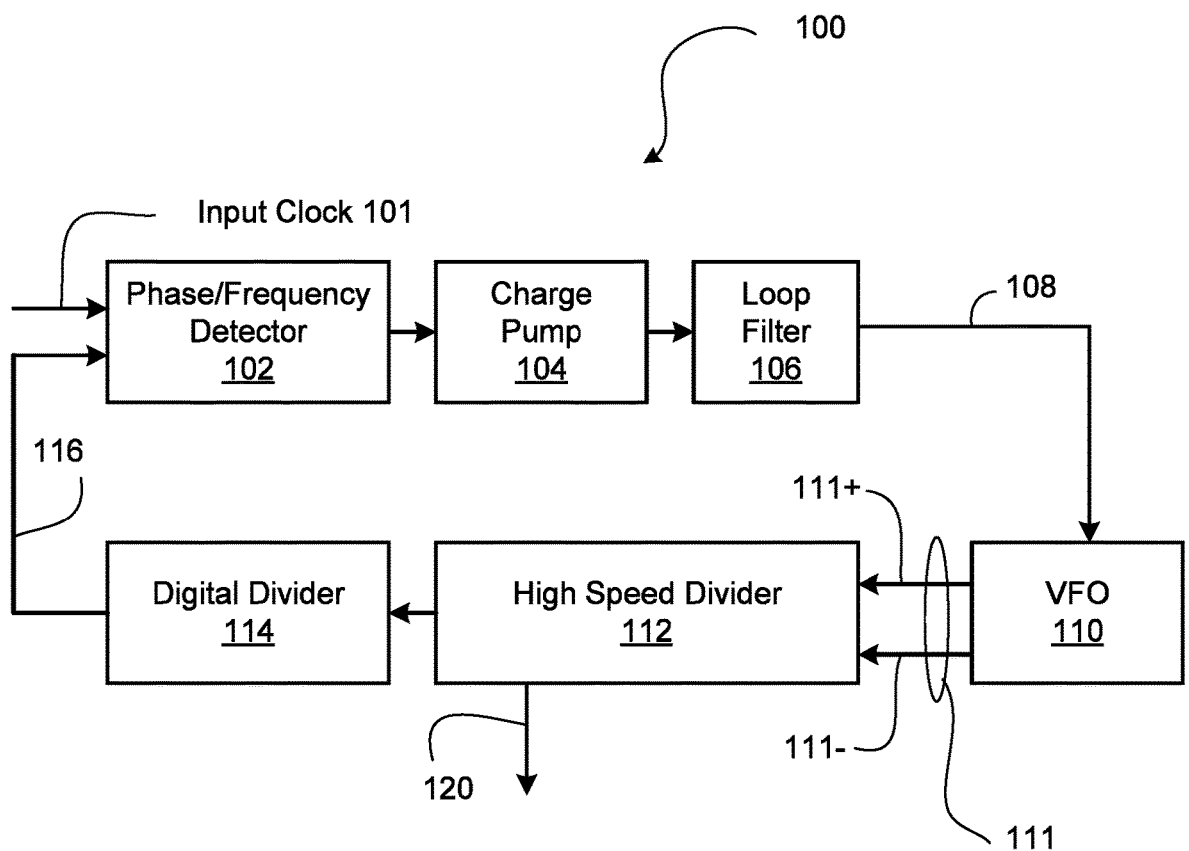
FIG. 1 is a block diagram of a clocking system usable in an electronic apparatus using embodiments of the invention.

Turning now to FIG. 1, an exemplary high speed clock generation system 100 utilizing embodiments of the invention is shown. An input clock 101 is input to phase/frequency detector 102. An output from phase/frequency detector 102 is driven to charge pump 104, driving more or less current depending on if the value on signal 116 compared to input clock 101 indicates that the frequency speed and phase of differential high frequency signal 111 needs adjustment. Loop filter 106 filters voltage from charge pump 104. VFO 110 produces the differential high frequency signal 111. A frequency of differential high frequency signal 111 is dependent on a voltage output by loop filter 106 on signal 108. High speed divider 112 receives high frequency differential signal 111 and divides the frequency of differential high frequency signal 111 by two. Digital divider 114 receives a clock signal from high speed divider 112, the clock signal being half the frequency of differential high frequency signal 111. Digital divider 114 performs a digital division to a signal 116 that can be compared to input clock 101. Exemplary and non-limiting divisions done by digital divider 114 may be 8, 16, 256, 1024, as well as non-power-of-two divisions. High speed divider 112 may also produce a high speed clock output 120 as will be described later.

Differential high frequency signal 111 is shown to have a plus phase 111+ and a minus phase 111−.

Figure 2:
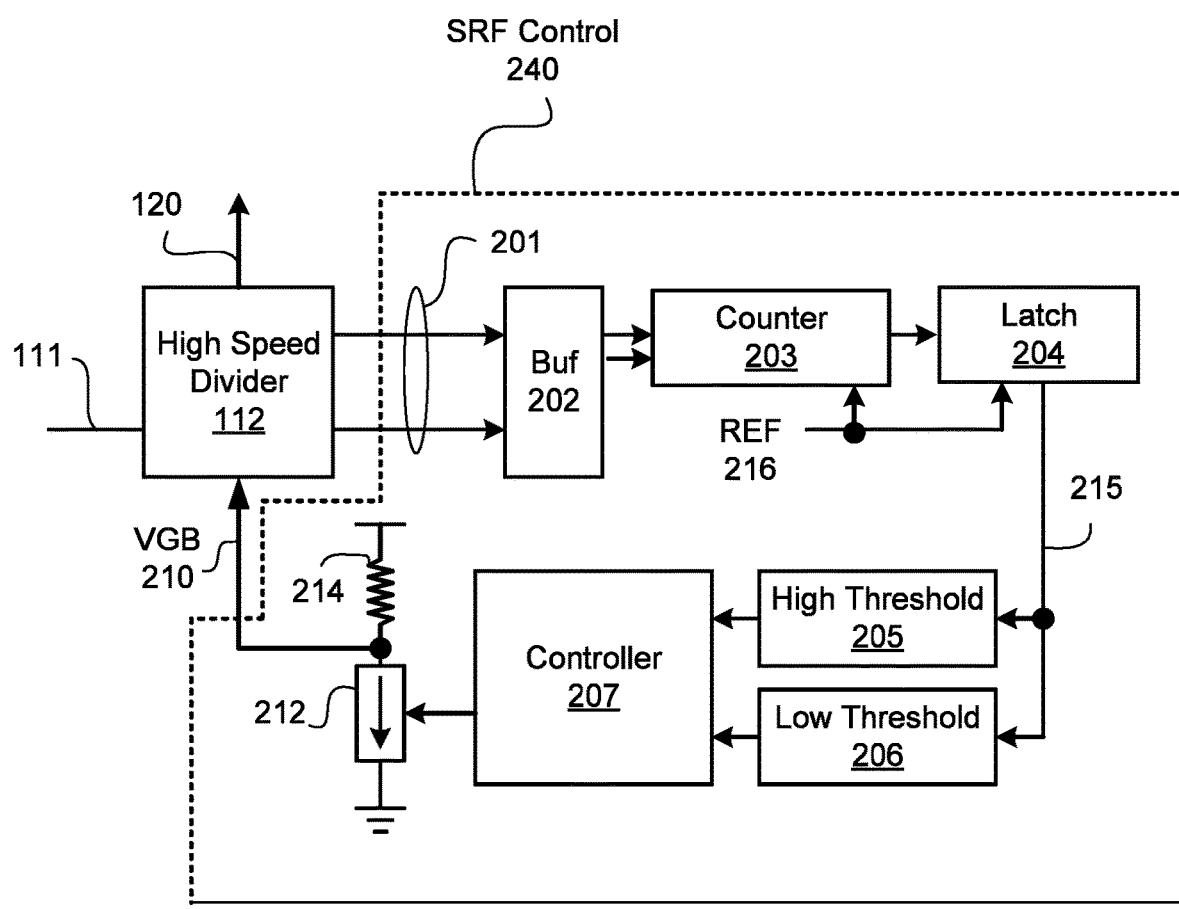
FIG. 2 is a block diagram of circuitry used to control a voltage used to speed up or slow down a self-resonant frequency (SRF) of a high speed divider.

With reference to FIG. 2, as mentioned above, embodiments of the invention control load resistance values. Load resistance and capacitance determine the SRF of high speed divider 112 as will be further described later. FIG. 2 also shows an exemplary block diagram of SRF control 240 for creating a voltage gate bias referenced as VGB 210, to control load resistance values in high speed divider 112.

As described earlier, high speed divider 112 receives differential high frequency signal 111, which is a differential signal in the present embodiment of the invention and produces a differential signal 201 which drives into SRF Control 240, and may be buffered by buffer 202 to reduce loading on differential signal 201. Differential signal 201 (buffered by buffer 202 in some embodiments) is driven to single counter 203 which is coupled to latch 204. Single 203 is initialized by conventional means. After a predetermined interval during a calibration time when high speed divider is self-resonating to determine proper load resistance, a value in single counter 203 is latched into latch 204 by reference 216.

For example, a designer wants to see how many cycles occurred on differential signal 201 in 100 nanoseconds when high speed divider 112 is running at SRF speed during calibration time. The designer wants, during normal operation, a 4.55 GHz clock to use for digital logic. The designer then wants the SRF to be 5 GHz, or 10% faster than normal operation of 4.55 GHz, where the VFO's differential high frequency signal 111 will be 9.1 GHz. The designer would expect the number of 5 GHz cycles in 100 nanoseconds to be (5e9 cycles/second*100e−9 seconds=500 cycles). As mentioned, due to process and temperature tolerances, resistance may easily vary by plus or minus 50% and capacitance will also vary. Therefore, a designer may choose to assume that up to 1000 cycles may occur during load resistance compensation and therefore make single counter 203 have 10 bits, to be able to count to 1024. Although the example uses an assumed 5 GHz SRF and a 100 nanosecond counting period, faster or slower frequencies on differential signal 201 and longer or shorter periods of counting by single counter 203 are contemplated.

After reference 216 is asserted, a count value in latch 204 is sent to high threshold 205 and to low threshold 206 on signal 215. Also, reference 216 may be used to halt and reset single counter 203. It will be understood that, in an embodiment, reference 216, when asserted, may stop counting in single counter 203, and the value of the single counter's latches are directly sent to high threshold 205 and low threshold 206; the single counter 203 may be reset, then again begin counting cycles of differential signal 201 upon activation by reference 216.

Values of high threshold 205 and low threshold 206 are designer determined values acceptable for the SRF in high speed divider 112. In the example given above, where a nominal value of SRF is given by a value of 500 in single counter 203, the designer may choose a value of 520 for high threshold 205 and a value of 480 for low threshold 206.

High threshold 205 and low threshold 206 may be registers, loadable in a conventional manner, so that the same high frequency divider circuitry may be used for different VFO high speed differential signals, and, therefore, different SRF frequencies, which are slightly higher than half the VFO high speed differential signal. Alternatively, high threshold 205 and low threshold 206 may be programmed with e-fuses in a conventional manner.

Controller 207 compares the value on signal 215 against the value in high threshold 205, and, if the value on signal 215 is higher than the value in high threshold 205 (in the example, greater than 520), the SRF is too fast and current source 212 is adjusted to change VGB 210 to slow the SRF of high speed divider 112. Current through current source 212 also goes through resistor 214 to develop voltage VGB 210. If controller 207 determines that the value on signal 215 is lower than the value in low threshold 205, then current source 212 is adjusted to change VGB 210 to increase the SRF of high speed divider 112.

The process described above may need to repeat until the SRF produces a count that is between the values in high threshold 205 and low threshold 206. The designer must ensure that adjustments made by controller 207 to the SRF are not so great as to cause the SRF to change so much as to jump over the gap between high threshold 205 and low threshold 206.

Figure 3:
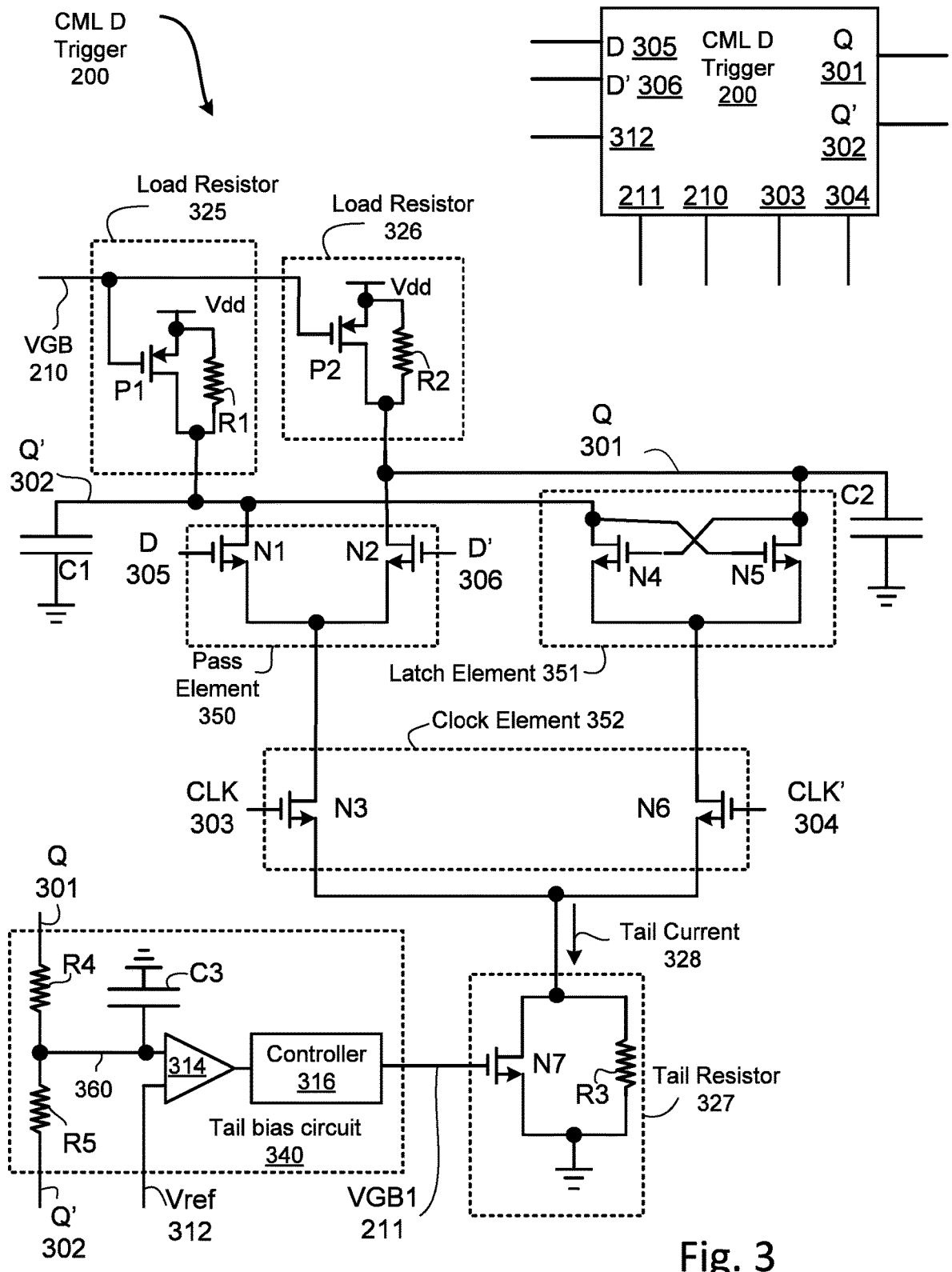
FIG. 3 is a circuit schematic of a Current Mode Logic (CML) D trigger block. Variable load resistors and a variable tail current circuitry are shown.
Figure 4:
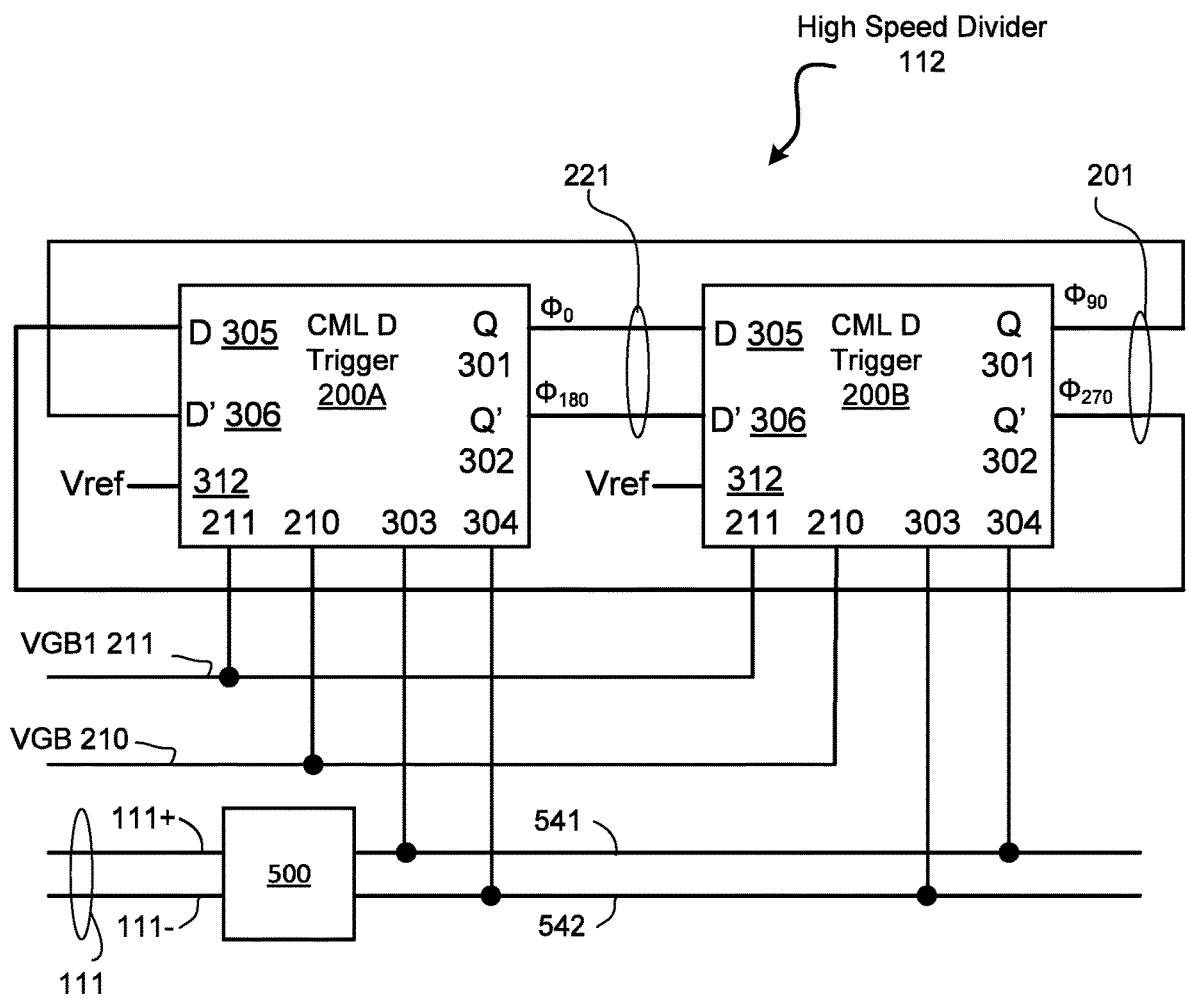
FIG. 4 shows a block diagram of two instances of the CML D trigger of FIG. 3 coupled together as a high speed divider.

With reference now to FIGS. 3 and 4, high speed divider 112 is shown to have two CML D triggers, shown as two instances of CML D trigger 200, denoted as CML D trigger 200A and CML D trigger 200B in FIG. 4.

FIG. 3 provides details of an exemplary embodiment of CML D trigger 200. CML D trigger 200 comprises a tail resistor 327, a pass element 350, a latch element 351, a clock element 352, a load resistor 325, and a load resistor 326.

Field Effect Transistors (FETs) are of two types: N-channel field effect transistors (NFETs) and P-channel field effect transistors (PFETs).

In tail resistor 327, NFET N7 and R3 provide a tail current 328 for the CML D trigger 200 shown. NFET N7 acts as a controllable resistance in parallel with R3.

Tail bias circuit 340 creates a voltage VGB1 211 to NFET N7 in tail resistor 327 to control a common mode voltage of high speed divider 112 differential output 201 to a voltage determined by Vref 312.

Tail bias circuit 340 comprises a resistor divider (R4 and R5) between plus and minus phases of output differential signal 201 (Q 301 and Q' 302). The resistor divider produces a voltage on node 360 that is a common mode voltage of differential signal 201. R4 and R5 are high enough resistance so that differential signal 201 is not significantly affected. Capacitor C3 filters noise on node 360. Operational amplifier 314 receives the voltage on node 360 on a first input and reference voltage 312 on a second input and outputs a signal to controller 316. Controller 316 produces VGB1 211 to adjust tail current 328 so that the common mode voltage of differential signal 201 is equal to reference voltage 312. In general, any method of controlling tail current 328 to vary to cause the common mode voltage of differential signal 201 to be controlled to a specified voltage may be used.

It is understood that NFET N7 may be in series with resistor R3 instead of being connected in parallel; further, there may be a stack of this NFET N7 and resistor R3 combination. In an embodiment, resistor R3 is omitted.

Clock element 352 comprises a differential pair of NFETs comprising NFETs N3 and N6 having sources coupled to tail current 328. NFET N3 receives CLK 303 on a plus clock input of clock element 352. NFET N6 receives CLK' 304 on a minus input of clock element 352. During normal operation, CLK 303 and CLK' 304 are coupled to differential high frequency signal 111. See discussion below and FIG. 5 for further explanation. During a process of calibration of load resistors for proper VGB 210 determination described above, CLK 303 and CLK' 304 are then both at a common mode voltage of differential high frequency signal 111, allowing high speed divider 112 to freely operate at the SRF determined by the present values of load resistance during the process of calibration.

When CLK 303 is "1" and CLK' 304 is "0", NFET N3 conducts tail current 328 and NFET N6 does not conduct. Tail current 328 is routed to pass element 350. If D 305 is "1" and D' 306 is "0", tail current 328 is routed by NFET N1 to signal Q' 302, and discharges C1. If D 305 is "0" and D' 306 is "1", tail current 328 is routed by NFET N2 to Q 301 and C2 is discharged. Tail current 328 also is coupled to load resistor 325 or load resistor 326 depending on if D 305 or D' 306 is conducting in pass element 350. Tail current 328 and value of load resistors 325 and 326 determine signal swings on Q 301 and Q' 302.

When CLK 303 is "1" NFET N1 or NFET N2 conducts tail current 328 depending on data inputs D 305 and D' 306. When CLK 303 is "1", and D 305 goes to "1", tail current 328 discharges node Q' 302 through NFET N1. D' 306 goes to "0" and NFET N2 is turned off and node Q 301 and capacitor C2 are charged up through load resistor 326 which comprises PFET P2 operating in linear region, and resistor R2. Likewise, when D' 306 goes to "1", Q' 302 and C1 are charged up through PFET P1 and R1 of load resistor 325.

VGB 210 controls PFETs P1 and P2 such that load resistors 325 and 326 charge C1 and C2 at a rate so that SRF is within a frequency bounded by the values in high threshold 205 and low threshold 206. As with the tail resistor 327 circuitry, it will be understood that PFET P1 may be connected in series with resistor R1 and PFET P2 may be connected in series with resistor R2 in various embodiments of the invention. Importantly, whatever R1 and PFET P1, and R2 and PFET P2 combination is chosen, VGB 210 must control the effective resistance combination to provide charging of C1 and C2 to provide an SRF to make the count value in single counter 203, during calibration time, within the bounds set in high threshold 205 and low threshold 206.

Capacitors C1 and C2 may represent parasitic capacitors on nodes Q' 302 and Q 301, respectively, or may further comprise additional capacitors, such as wire-to-wire capacitance, separate NFET and/or PFET capacitors, or other designer implemented capacitance.

When CLK 303 goes to "0" and CLK' 304 goes to "1", the values on Q 301 and Q' 302 are latched in latch element 351 using cross coupled NFETs N4 and N5 as tail current 328 flows through NFET N6 in clock element 352.

Also on FIG. 3 is shown a high level block for CML D trigger 200.

Returning to FIG. 4, note that the two instances of CML D triggers 200, denoted as CML D triggers 200A and 200B, are configured to divide differential high frequency signal 111 by two, with plus phase Q 301 output of CML D trigger 200B connected to minus input D' 306 of CML D trigger 200A. Minus phase Q' 302 of CML D trigger 200B is connected to plus input D 305 of CML D trigger 200A. Plus phase Q 301 output of CML D trigger 200A is connected to plus phase D 305 of CML D trigger 200B; minus phase Q' 302 output from CML D trigger 200A is connected to minus phase D' 306 of CML D trigger 200B.

Differential high frequency signal 111 is input to initialization circuit 500. During normal operation 111+ is output on signal 541 and 111− is output on signal 542. During calibration when high speed divider 112 is self-resonating, a common mode voltage of differential high frequency signal 111 is sent on both signal 541 and signal 542. Signal 541 is routed to input 303 of CML D trigger 200A and to input 304 of CML D trigger 200B. Signal 542 is routed to input 304 of CML D trigger 200A and to input 303 of CML D trigger 200B.

High speed divider 112 produces two differential signals (201 and 221), each at half the frequency of differential high frequency signal 111. As shown in FIG. 4, phases 0 and 180 degrees are output on differential signal 221 from CML D trigger 200A, and phases 90 and 270 degrees are output on differential signal 201 from CML D trigger 200B.

Frequency of differential signals 201 and 221 is half the frequency of differential high frequency signal 111. When single counter 203 is implemented as a differential counter, differential signal 221 (phases 0 and 180) or differential signal 201 (phases 90 and 270) could be input to single counter 203. If single counter 203 is implemented as a non-differential counter, a designer could input output Q 301 or Q' 302 from either CML D trigger 200A or CML D trigger 200B, with suitable buffer 202, to single counter 203.

The high speed clock output 120 to digital latches on the semiconductor chip may be from differential high frequency signal 111 or, at half the frequency of differential high frequency signal 111, may be clocked by either differential signal 201 (shown in FIG. 2) or differential signal 221. Suitable buffering of the high speed clock output would be needed to limit loadings on the VFO 110 output (differential high frequency signal) or the high speed divider 112 outputs to clock the digital latches.

Figure 5:
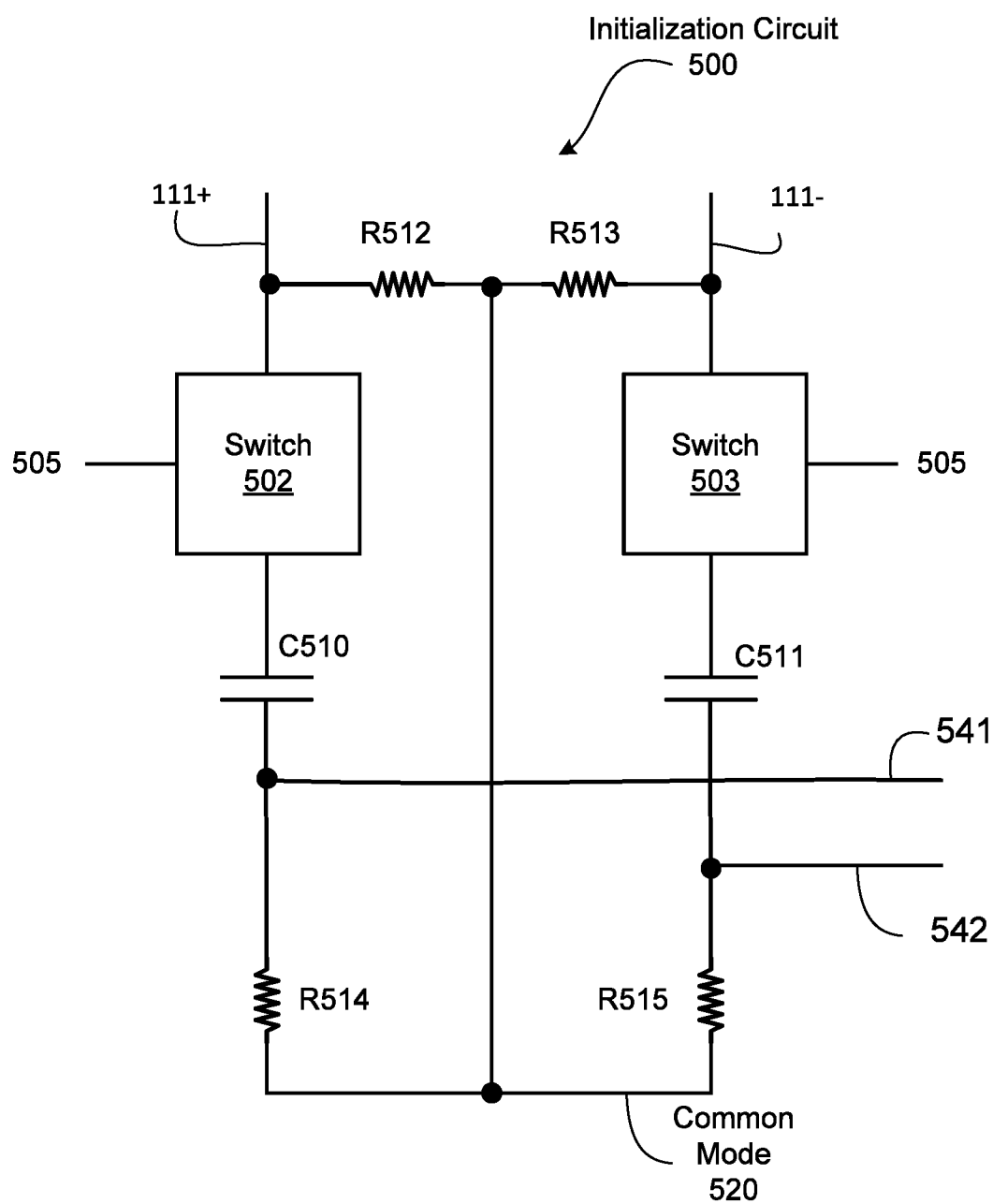
FIG. 5 shows circuitry used during a calibration time to couple a common mode voltage of a differential high frequency signal to clock inputs of the two CML D triggers to allow the high speed divider to self-resonate.

FIG. 5 shows initialization circuit 500 configured to allow high speed divider 112 to self-resonate without being clocked by differential high frequency signal 111 during a calibration time, but to forward differential high frequency signal 111 during normal operation. This is required so that the SRF of high speed divider 112 can be made close to and a margin value selected by the designer above the frequency of the differential high frequency signal 111. Variation of SRF is controlled as explained above within values specified in high threshold 205 and low threshold 206.

Initialization circuit 500 receives differential high frequency signal 111 plus phase 111+ and minus phase 111− as shown.

In normal operation, signal 505 closes switches 502 and 503, allowing differential high frequency signal 111 signals 111+ and 111− to be capacitively coupled through C510 and C511 to signal 541 and signal 542. Switches 502 and 503 may be well-known CMOS transmission gates comprising PFET and NFET devices having complimentary gate voltages such that both devices are activated or deactivated together.

During calibration time, when PFET P1 and PFET P2 in load resistors 325 and 326 of CML D trigger 200 are adjusted to bring the SRF to be at a frequency bounded by high threshold 205 and low threshold 206, signal 505 opens switches 502 and 503. Resistor network R512, R513, R514, and R515 provides a common mode voltage of differential high frequency signal 111 at node common mode 520. This voltage is coupled to signal 541 and signal 542 through R514 and R515 as shown. A designer chooses R512, R513, R514, and R515 values of high enough resistance such that differential high frequency signal 111 during normal operation and during calibration time is not significantly degraded in frequency or amplitude.

The CML D trigger 200 has been described in drawings and specifications using NFETs in tail resistor 327, tail bias circuit 340, clock element 352, pass element 350, and latch element 351. PFETs are used in load resistors 325 and 326. Those of skill in the art will understand that CML D trigger 200 may also be implemented "upside down", with tail resistor 327 coupled to VDD (a positive voltage supply) instead of ground Clock element 352 may comprise a differential pair of PFETs. Pass element 350 may comprise a differential pair of PFETs. Latch element 351 may comprise a cross coupled pair of PFETs. Load resistors 325 and 326 may comprise NFETs operating in linear region and coupled to ground instead of VDD.

FIG. 6 is a table showing maximum SRF variation for conventional CML divide by two circuit and a maximum SRF variation for high speed divider 112. Calibration of the compensated high speed divider 112 was simulated at 27 degrees Celsius.

A first column in the table is "process corner" where NFETs and PFETs are: "ss" (slow, that is, at the slow end of a particular process range); "tt" (typical in the particular process range); "ff" (fast end of the particular process range).

Second, third, and fourth columns in the table are for temperature conditions.

For high speed divider 112, maximum SRF variation across process range and temperature is 3.73%. for the conventional CML divide by two circuit, maximum SRF variation is 24.27%, demonstrating that delay compensation of a frequency divider provides a significant improvement in SRF variability.

Figure 7:
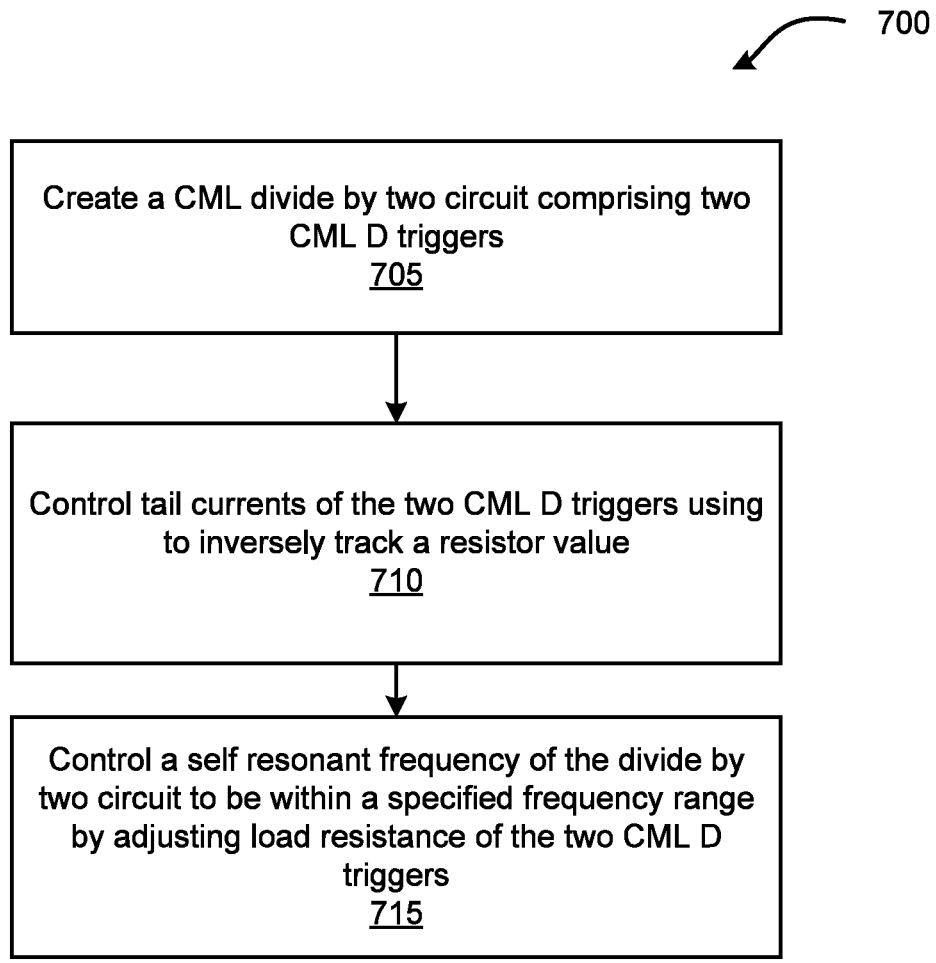
FIG. 7 is a high level flow chart of a method to control a self-resonant frequency of a high speed divider.

With reference now to FIG. 7, a high level flow chart 700 is shown of a method to control the SRF of a CML high speed divider as shown in discussion of the high speed divider 112 above.

In step 705, a CML high speed divider comprising two CML D triggers is shown. The high speed divider receives a differential high frequency signal and produces a first and second differential clock signal, each half the frequency of the differential high frequency signal. The first differential clock signal comprises phases of 0 and 180 degrees. The second differential clock signal comprises phases of 90 and 270 degrees.

In step 710, tail currents of the two CML D triggers are adjusted to adjust a common mode voltage of differential signals output by the two CML D triggers to a specified value.

In step 715, the SRF of the high speed divider is set to be between a specified frequency range, the specified frequency range being in a margin range above half of the frequency of the differential his speed signal. PFETs operating in the PFETs' linear range of operation are used to control the speed of SRF by increasing or decreasing load resistor value, thereby slowing or speeding up the SRF by slowing down or speeding up charging of capacitance in the CML D triggers.

Figure 8:
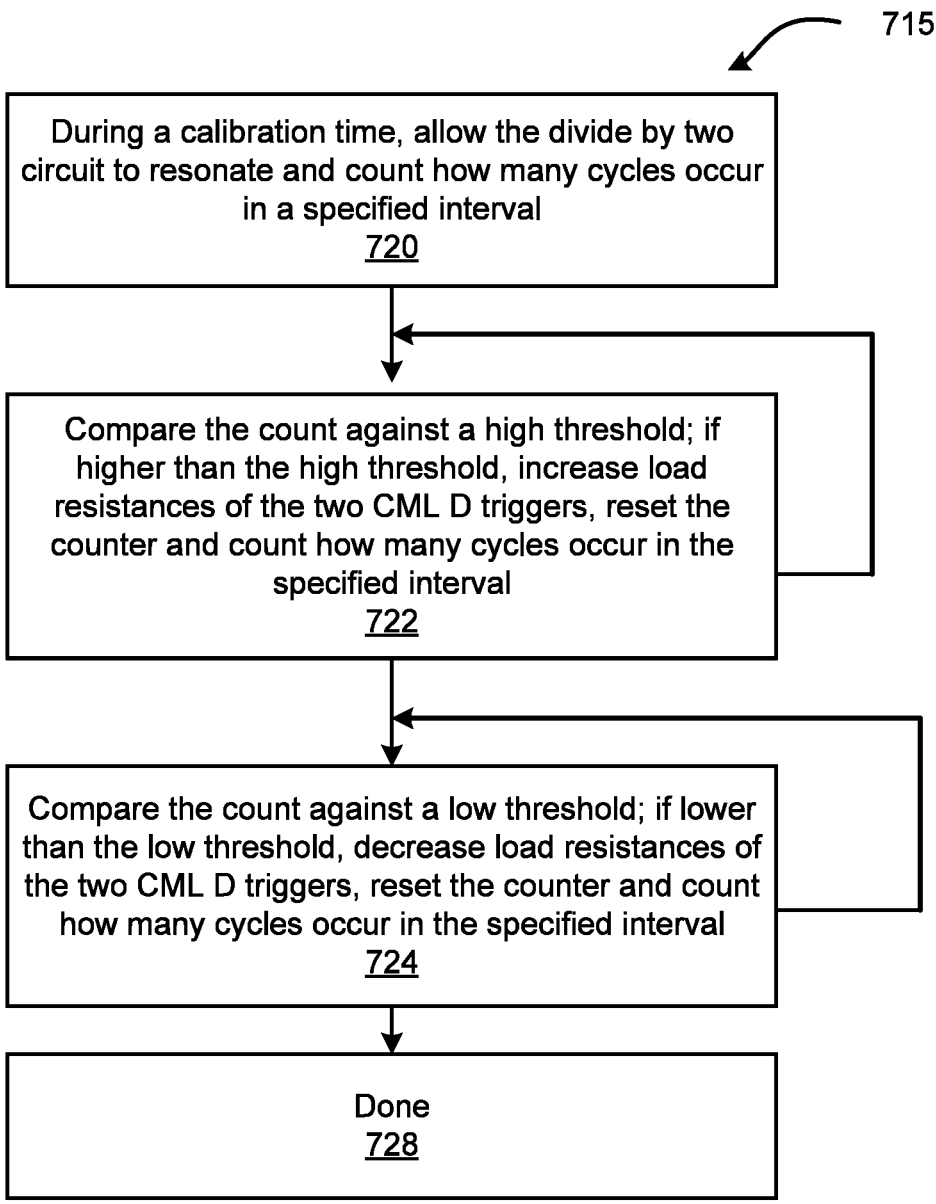
FIG. 8 is a more detailed flow chart of the method shown in FIG. 7.

With reference now to FIG. 8, step 715 is shown in more detail

In step 720, during a calibration time, the high speed divider is set to operate in a self-resonant mode, with clock inputs of the two CML D triggers coupled to a suitable voltage, such as a common mode voltage of the differential high frequency signal. A single counter counts how many cycles at a current SRF occur during a specified time interval.

In step 722 if a count accrued in the single counter during the specified time interval is higher than a high threshold, load resistances in the two CML D triggers are increased. This will slow charging of capacitances and reduce the SRF. Load resistances are increased by changing gate bias in an FET operating in the linear region to cause the FET to be more resistive in each CML D trigger. Step 722 is repeated until the count is less than the high threshold. When the count becomes less than the high threshold, control is passed to step 724.

In step 724, if the count accrued in the single counter during the specified time interval is lower than a low threshold, load resistances in the two CML D triggers are decreased. This will increase charging of capacitances and increase the SRF. Load resistances are decreased by changing gate bias in an FET operating in the linear region to cause the FET to be less resistive in each CML D trigger. Step 724 is repeated until the count is greater than the low threshold at which time control passes to step 728.

In step 728, method 715 ends.

What is claimed is:

1. A divider comprising:
   an input to receive a differential signal;
   two current mode logic (CML) D triggers, each CML D trigger further comprising a tail resistor, a first load resistor, and a second load resistor;
   the tail resistor in each CML D trigger comprises a tail resistor FET of a first type biased with a tail resistor bias voltage, the tail resistor bias voltage controlling the tail resistor to produce a tail current that controls a common mode output in each CML D trigger to a specified voltage;
   the first and second load resistors in each CML D trigger each comprising a FET of a second type biased, with a load resistor bias voltage, in a linear region of operation, the load resistor bias voltage controlling the first and second load resistors in each CML D trigger such that a self-resonant frequency (SRF) of the divider operates within a specified frequency range;
   wherein
   the two CML D triggers comprise a first CML D trigger and a second CML D trigger;
   during normal operation a plus phase of the differential signal is used as a plus clock input and a minus phase of the differential signal is used as a minus clock input for the first CML D trigger;

during normal operation the plus phase of the differential signal is used as a minus clock input and the minus phase of the differential signal is used as a plus clock input for the second CML D trigger;

a plus output of the first CML D trigger is input to a plus data input of the second CML D trigger and a minus output of the first CML D trigger is input to a minus data input of the second CML D trigger; and a plus output of the second CML D trigger is input to a minus data input of the first CML D trigger and a minus output of the second CML D trigger is input to a minus data input of the first D trigger;

each CML D trigger comprising:

a clock element comprising a differential pair of FETs comprising differential pair comprising a first FET of the first type and a second FET of the first type, the first FET of the first type having a gate coupled to the plus clock input, and a second FET of the first type having a gate coupled to the minus clock input, source nodes of the first and second FETs of the first type coupled to a drain of the tail resistor FET of the first type;

a pass element comprising a differential pair of FETs of the first type, the differential pair having a third FET of the first type and a fourth FET of the first type, a drain of the first FET of the first type coupled to sources of the third and fourth FETs of the first type, a gate of the third FET of the first type having a gate coupled to the plus data input and a fourth FET of the first type having a gate coupled to the minus data input;

a drain of the third FET of the first type coupled to the minus output of the CML D trigger and a drain of the fourth FET of the first type coupled to the plus output of the CML D trigger;

a drain of the second FET of the first type coupled to sources of a latch element differential pair, the latch element differential pair having a fifth FET of the first type and a sixth FET of the first type, a drain of the fifth FET of the first type coupled to the minus output of the CML D trigger and to a gate of the sixth FET of the first type;

a drain of the sixth FET of the first type coupled to the plus output of the CML D trigger and to a gate of the fifth FET of the first type; the first load resistor is coupled to the minus output of the CML D trigger and the second load resistor is coupled to the plus output of the CML D trigger;

a tail bias circuit to produce the tail resistor bias voltage for the tail resistor, the tail bias circuit comprising a voltage divider coupled between plus and minus phases of a differential output of at least one of the CML D triggers, a voltage produced by the voltage divider is coupled to a first input of an operational amplifier and a reference voltage is coupled to a second input of the operational amplifier, an output of the operational amplifier is coupled to a controller that drives the tail resistor bias voltage.

2. The divider of claim 1 wherein: all FETs of the first type are NFETs; and all FETs of the second type are PFETs.

3. The divider of claim 1 wherein: All FETs of the first type are PFETs; and All FETs of the second type are NFETs.

4. The divider of claim 1, further comprising:

an initialization circuit to put the divider into a self-resonant mode during a calibration time, and passing the differential signal in normal mode, the initialization circuit comprising:

a first switch having a first end coupled to a plus phase of the differential signal and a second switch having a first end coupled to a minus phase of the differential signal;

a first capacitor coupled between a second end of the first switch and the plus clock input of the first CML D trigger and to the minus clock input of second CML D trigger;

a second capacitor coupled between a second end of the second switch and to the minus clock input of the first CML D trigger and to the plus clock input of the second CML D trigger; and a resistor network to make a high impedance common mode voltage of the differential signal drive the plus clock input and the minus clock input of the first and second CML D triggers when the first and second switches are opened.

5. The divider of claim 1 further comprising:

a single counter to count cycles of the divider during a calibration time;

a high threshold coupled to the single counter to compare against the single counter value at an end of the calibration time and a low threshold coupled to the single counter to compare against the single counter value at the end of the calibration time; and a controller to adjust a current source coupled to a resistor to generate a voltage to cause the load resistor bias voltage to make the load resistors a higher resistance when the single counter value is greater than the high threshold and to make the load resistors a lower value when the single counter value is less than the low threshold.

6. The divider of claim 5, further comprising a buffer between the divider and the single counter.

7. The divider of claim 5, further comprising a latch to hold the value of the single counter at the end of the calibration time to couple the single counter to the high and low thresholds.

8. The divider of claim 5, the high threshold and the low threshold are loadable registers.

* * * * *